United States Patent [19]

Brentlinger

[11] 4,362,973

[45] Dec. 7, 1982

[54] AESTHETICALLY PLEASING CRT-DISPLAY OF SINGLE-SOURCE SIGNALS

[76] Inventor: Brent R. Brentlinger, 1645 E. Thomas Rd., Apt. 409, Phoenix, Ariz. 85016

[21] Appl. No.: 965,569

[22] Filed: Dec. 1, 1978

[51] Int. Cl.³ .............................................. H01J 29/72
[52] U.S. Cl. .................................................. 315/393
[58] Field of Search .............. 315/393, 394, 395, 378; 340/743

[56] References Cited

U.S. PATENT DOCUMENTS

| | | | |
|---|---|---|---|
| 2,537,104 | 1/1951 | Taylor | 315/378 |
| 3,659,142 | 4/1972 | Phillips | 315/378 |

OTHER PUBLICATIONS

Inversion Layer Probe, IBM Technical Disclosure Bulletin, vol. 13, No. 5, Oct. 1970.
J. Rider et al., Encyclopedia on Cathode Ray Oscilloscopes and Their Uses, J. F. Rider Publisher, N.Y.C., 1950, pp. 437–444.

Primary Examiner—Theodore M. Blum
Attorney, Agent, or Firm—James F. Duffy

[57] ABSTRACT

An aesthetically pleasing Lissajous figure is derived from a single signal source which feeds a common signal to both the horizontal and vertical deflection circuits of a cathode ray tube. Between the signal source and one or the other of said deflection circuits, a time delay is utilized to retard the transit of the signal to that deflection circuit. With a fixed frequency source, the Lissajous figure presented will be an ellipse whose eccentricity will be determined by the frequency of the signal output by said source. Where the signal source provides an output which randomly varies in frequency, the Lissajous figures presented will be reentrant in nature and of a character determined by the rate of change of frequency from said source and the magnitude of the time delay inserted in the selected deflection circuit. The invention lends itself to use with single or multiple gun CRT's and in either case may be used with monochromatic or polychromatic phosphorescent screens. When utilized with the three-color CRT employed by today's color television sets, three Lissajous figures may be produced, each in their own purety of hue.

4 Claims, 3 Drawing Figures

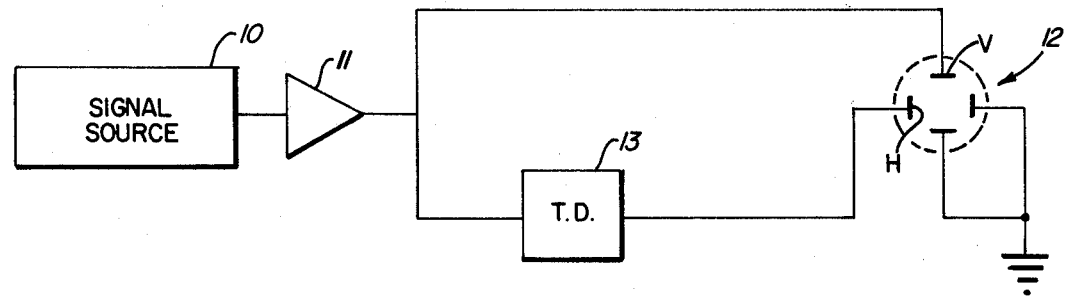
_FIG-1_
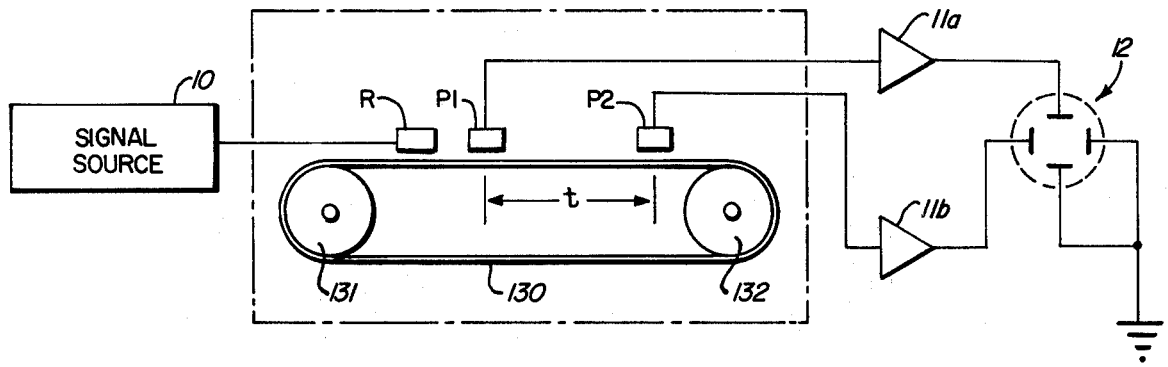
_FIG-2_
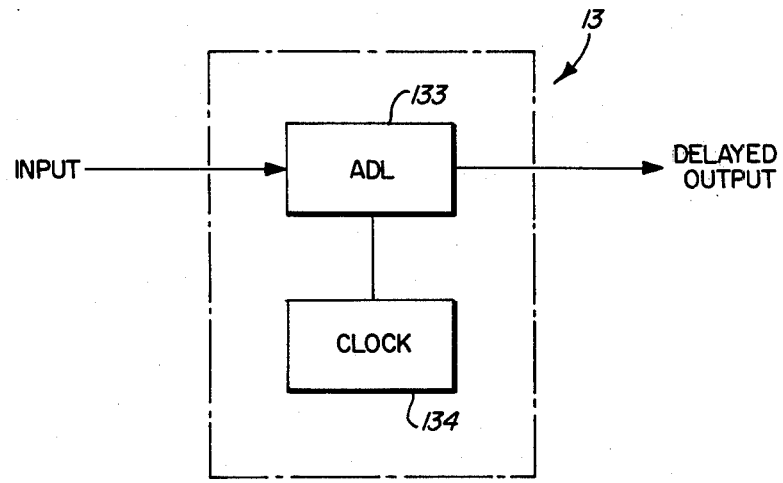
_FIG-3_

AESTHETICALLY PLEASING CRT-DISPLAY OF SINGLE-SOURCE SIGNALS

The invention relates to apparatus and method for portraying electrical signals on a cathode ray tube (CRT).

In particular, the invention relates to a cathode ray tube display of signals, which display is aesthetically pleasing. The invention may be further said to relate to apparatus and method for obtaining Lissajous figures on a CRT screen while utilizing a single source of signal.

More particularly still, the invention relates to method and apparatus for forming an aesthetically pleasing visual display on a CRT using a randomly varied signal derived from a single source.

As is well known in the prior art, an electron stream is used to produce a visible image on a luminescent screen at the point at which the electron stream impinges. The point of impingement is controlled by deflecting the electron stream using a transverse magnetic or electric field. A voltage applied between a pair of oppositely opposed deflection plates surrounding an electron stream will cause the stream to be directed toward that plate which is the most positive. The angle at which the stream will be deflected will be proportional to the strength of the electric field established between the two plates. When an alternating voltage is applied to the pair of plates, the electric field set up between the plates varies continually in magnitude and direction. The stream of electrons is thus directed back and forth between the plates, and the luminescent spot on the screen is drawn out into a line symmetrically disposed about the point at which the undeflected beam would have impinged. Should a second pair of deflection plates be provided at right angles to the first pair, then an alternating voltage applied to the second pair of plates will produce a luminescent line on the screen at right angles to the line formed when an alternating voltage was applied to the first pair of plates. If the two voltages are applied to both pair of plates simultaneously, the electron stream will follow the instantaneous resultant force exerted by both electric fields and will trace a closed pattern on the screen. These patterns will appear stationery when the frequencies of the deflection signals bear a simple relationship to one another.

The patterns formed as described above are well known as Lissajous figures. When the deflection voltages are each of the same frequency, the pattern is an ellipse of varying eccentricity which at the extremes becomes a straight line or a circle. The exact figure is determined by the phase difference between the two signals. When the ratio of frequencies is other than one to one, the patterns become reentrant. In the general case, the ratio of the number of loops formed on adjacent sides of the screen pattern is the ratio of the two frequencies.

If a single voltage source is used to provide the deflection signal to both pair of deflection plates, then a straight line presentation will be visible on the luminescent screen of the CRT. Under these circumstances, variation in the frequency of the input signal will not affect the straight line presentation on the CRT screen.

If a single voltage source is used to drive both pair of deflection plates, with a frequency-insensitive, phase shifting element in series with the signal input to one pair of deflection plates, then a Lissajous figure will appear on the CRT screen that is a straight line when the phase shifting element causes a phase difference at each pair of deflection plates of zero or one hundred eighty degrees; a circle when the phase difference introduced is ninety or two hundred seventy degrees; or an elliptic shape varying between these extremes. Varying the frequency of the voltage source employed will have no affect on the shape of the figure displayed on the CRT screen.

It may thus be seen that employing a single voltage source to provide Lissajous figures on a CRT results in an easily predictable, inanimate, presentation on the CRT even though the output frequency of the signals from that voltage source are randomly varied. The display tends to be boring to the viewer and offers no aesthetic pleasures. To overcome this drawback, those familiar with the art have employed frequency sensitive phase shifting elements so that the Lissajous figure presented is not a static one but is a family of randomly varying elliptic shapes. While the shape of the figure presented varies with the frequency of the signal source, nevertheless, a repetitious pattern of change from straight line through ellipse, through circle, through ellipse, to straight line again becomes soon apparent. This is due to the fact that although the phase angle between the signals driving each pair of plates is varying with the frequency of the drive signal, each pair of deflection plates is being driven by the same frequency.

Those familiar with the art have sought to alleviate this latter problem of repetitious imagery by utilizing two signal sources to obtain display on the CRT screen. If each of the signal sources is randomly variable in frequency, then the figures presented on the display will no longer be simple ellipses, but will be formed of more complicated reentrant patterns. The variation and non-predictable character of these patterns may have a pleasant effect upon the viewer. Unfortunately, the production of such pleasing, randomly variable patterns has been limited by the prior art to the use of multiple sources of deflection signals.

It is an object of the present invention to overcome the drawbacks found in the prior art methods and apparatus for providing aesthetically pleasing CRT display patterns using a single source of deflection voltages.

It is a more specific object of the present invention to provide randomly varying Lissajous patterns derived from a single source of randomly varied signals.

It is a specific object of the invention to provide a simple methodology for the provision of such pleasingly interesting Lissajous figures.

Even more specifically, it is an object of the invention to provide a state-of-the-art solution to the problem of providing aesthetically pleasing Lissajous figures derived from a single source of randomly varied signals.

The invention may be summarized as one which utilizes a single signal source of randomly-varied-frequency signals, the output of which source is used to drive mutually orthogonal deflection plates of a cathode ray tube. In practice, the output of the single signal source is applied directly to one pair of deflection plates while the same signal is introduced to the orthogonally disposed pair of deflection only after traversing a time delay element. Because the frequency of the signal from the single source is randomly varied, the time delay introduced in the path to one of the pairs of deflection plates results in a Lissajous pattern presentation resulting from the vector addition of two different frequency deflection signals. The point should be made here that a "time delay" rather than a "phase delay" element is introduced into one of the deflection lines. With a phase delay, the pattern derived is always the resultant vector of two deflection signals, each of the same frequency, but of differing phase angle. The presentation there is limited to the elliptic form. In the instant case, the introduction of a time delay assures that the pattern will always be the vector resultant of drive signals, each of different frequencies. When a time delay is employed, the viewer is assured that the Lissajous patterns which he views will contain not merely variations in elliptic shape, but more involved, and more interesting, reentrant figures.

As the practices of the present invention are taught herein, the advantages and the objectives of the present invention will be made clear to those versed in the state of the art, especially when the following description is read in conjunction with the accompanying drawings, in which:

FIG. 1 illustrates the basic time delay concept for deriving aesthetically pleasing Lissajous figures on a CRT using a single source of randomly variable signals.

FIG. 2 illustrates the invention employing a magnetic tape recorder/player utilizing dual pick-up heads so that a time delay exists between the extraction of the information by one pick-up head and that of the second pick-up head.

FIG. 3 illustrates a state-of-the-art method of achieving a time delay using an integrated circuit analogue delay line.

In the foregoing discussion and that which follows, mention is made of electrostatic deflection plates for use with the CRT. This is not to imply that the invention is limited to use with cathode ray tubes employing electrostatic deflection and focusing. It is true that in most cases it is easier and more economical to use electric focusing and deflection such as is often done in low-priced television equipment and in oscilloscopes. However, magnetic focusing produces a better spot and magnetic deflection results in less deflection defocusing. This permits wider angle deflection so that a shorter CRT may be utilized. Thus, all-magnetic tubes may well be preferred in any embodiment utilizing the invention. It is for purposes of discussion and conceptual simplicity that the disclosure herein is given in terms of electrostatic deflection. The teachings of the invention may be applied with equally beneficial results to either electric or magnetic deflection systems.

FIG. 1 is the basic concept of producing Lissajous patterns by introduction of a timing differential between orthogonally opposed deflection circuits. In FIG. 1, signal generator 10 represents a source of signals randomly variable in frequency and in amplitude. The output of signal generator 10 is fed to deflection amplifier 11, whose output, in turn, is split and fed, one part directly to the vertical deflection circuitry V of CRT 12, the other transiting time delay 13 before being applied to the horizontal deflection circuitry H of said CRT. The choice of the horizontal deflection circuitry as that containing the time delayed deflection signal is for convenience only, and the invention will perform its designed function so long as the time delay appears in either the vertical or the horizontal deflection circuit. Since the output of signal generator 10 is a signal which randomly varies in frequency and amplitude, the introduction of the time delay 13 assures that a Lissajous pattern resulting on the screen of CRT 12 will be the vector resultant of two different deflection signals; for example, $f_1 + f_2$. This comes about because the frequency of the signal output by signal generator 10 is varying. Thus, in the time it takes a given signal $f_1$ to traverse the delay and reach the horizontal deflection plates H of CRT 12, the same signal $f_1$ had already been applied to vertical deflection circuits V and been replaced by later occurring vertical deflection signal $f_2$. It may then be seen that at the instant in time at which the electron stream of CRT 12 is caused to be deflected, the deflection is the instantaneous resultant exerted by the fields established by deflection signals $f_1$ and $f_2$.

It may be beneficial to consider an arrangement similar to that illustrated in FIG. 1 but with the substitution of a phase shifting element to replace time delay element 13. In this case, the signals being applied to the vertical deflection circuitry would be $f_1$ while the signal being applied to the horizontal deflection would also be $f_1$, but the horizontal deflection signal would be out of phase with that of the vertical deflection signal. Since both vertical and horizontal deflection signals are at the same frequency, the Lissajous pattern formed will be elliptic, the degree of eccentricity of the ellipse being determined by the amount of phase delay introduced into the horizontal deflection circuit. No more involved Lissajous figure is possible. It is only when signals of different frequencies are simultaneously applied to vertical and horizontal deflection plates that the patterns become reentrant, forming multiple loops in accordance with the ratio of the frequencies of the signals applied.

To fully understand the workings of the invention, it is necessary to realize the distinction between time delay and phase shift. For example, a true phase shifter will not affect the transit time of the signal traversing it but will introduce a phase shift which is independent of the frequency of the incoming signal. A time delay introduces a fixed delay in the transit time through the device, which delay is independent with frequency. However, the time delay may, in addition to introducing the transit time increase, introduce a frequency sensitive phase shift to the signal traversing the time delay. For example, a one millisecond time delay is the equivalent of a ninety degree phase shift at four kHz, and a hundred and eighty degree phase shift at two kHz.

In the present invention which introduces a fixed time delay between the vertical and horizontal deflection circuitry, the Lissajous figure derived will always be the resultant of deflection signals of different frequencies except in the case in which the randomness of the incoming signals from signal source 10 causes a signal at a particular frequency to be sustained for a period of time longer than the delay introduced by time delay 13. For a sustained frequency signal of such duration, the Lissajous pattern once again will assume the familiar elliptic configuration, the degree of ellipticity being dependent upon the phase delay equivalent of time delay 13. In most instances, however, as where the source of deflection signals 10 constitutes speech or music, the amplitude and frequency of the incoming signals will vary at a rate such that time delay 13 performs its primary function of inhibiting the simultaneous arrival of deflection signals of common frequency at the deflection plates of CRT 12.

In utilizing the invention to gain the greatest aesthetic appeal, consideration should be given to the choice of phosphor used for coating the screen of the cathode ray tube employed with the invention as well as the phosphorescent persistence of the screen. Phosphors are available which appear to the average human eye as white, blue, green, or yellow. The blue and green phosphors are easy on the eye and viewing of patterns on screens of this color may be prolonged without discomfort.

The degree of phosphorescent persistence may also contribute to the enjoyment of the viewer. Thus, a short persistence screen will leave little residual record of the previous passage of the beam in forming an earlier Lissajous figure, while a screen of medium persistence will allow the previous traces to fade gradually while a new Lissajous figure is being drawn. The use of the screen having an exponential decay characteristic, such as sometimes employed in radar applications, might well provide interesting and arresting visual presentations for musical works and the like which have repetitious passages interspersed throughout the main theme.

Since the invention lends itself to use with a single signal source such as a microphone, the Lissajous figure representation might well be used as a learning and corrective aid in the field of speech therapy. A deaf person capable of perceiving the pattern on the screen could be trained to use his voice to duplicate the Lissajous figure formed as an instructor vocalizes speech sounds, words, and sentences.

The invention may also be applied to obtain a visually appealing, multicolor projection of Lissajous figures derived from a single signal source by utilizing three CRT's, each of a different primary color phosphorescence, in a CRT projection system. The projections of each of the said three CRT's could then be aligned or misregistered on the projection screen, allowing the projected colors to meld and blend so as to form a multicolor display.

The state of the art of CRT development is such as to permit the incorporation of several electron beam-forming guns within the envelope of the tube. Such a tube, utilized with the invention, would provide for the simultaneous presentation of three similar Lissajous figures on the screen of the CRT. Intensity modulation (Z modulation) of each of the electron beams independently would change the visual characteristics of the overall presentation. By judicious choice of the manner in which each individual beam is intensity modulated, the appearance of three distinct and independent Lissajous patterns may be derived from the common signal source.

The three electron-gun, color matrix screen, television tube well known in the art today readily lends itself to use with the present invention. With the three-color tube, three, pure color, Lissajous figures are formed. As indicated above, these three patterns may be made to appear distinctly independent of each other by a controlled selection of the degree and type of intensity modulation applied to each of the different electron beams.

There are several ways in which a time delay such as herein suggested may be achieved. The most simplistic approaches to obtaining a time delay, such as differential length transmission paths or dielectric loading of the transmission line to control propagation velocity, are also the least practicable in terms of the frequency of the signals which will typically be employed in practicing the invention.

A practical, but somewhat cumbersome, approach to practicing the invention is indicated in FIG. 2. Here the time delay 13 is achieved using a tape player/recorder. The recorder consists of an endless tape 130 travelling on take-up reels 131 and 132. The signal to be used in deriving the Lissajous figures is passed from its source 10 to recording head R. Pick-up head P1 extracts the signal information from the tape, passing it through deflection amplifier 11a to the vertical deflection plates of CRT 12. At a later time, t, pick-up head P2, extracts the same information, passing it through deflection amplifier 11b to the horizontal deflection plates of CRT 12. The time delay, t, is established by the physical displacement between pick-up heads P1 and P2 along the length of tape 130.

FIG. 2, while not being a preferred embodiment of the invention, does make clear that when signal source 10 outputs a signal whose frequency is randomly varied, then each of the pick-up heads, P1 and P2, will be extracting distinctly different signal information. Thus, the signals applied to the vertical deflection circuits of CRT 12 will be distinctly different from those applied at the same instant to the horizontal deflection circuits of CRT 12, except in those occasional instances in which signal source 10 generates a sustained frequency signal having a duration greater than t. Therefore, the Lissajous pattern formed on the screen of CRT 12 will be the resultant of deflection signals of differing frequencies and, therefore, the patterns will be reentrant and involved. Simpler elliptic patterns will present themselves only on the occasion in which signal source 10 produces a sustained frequency signal of duration greater than t.

The displacement of deflection amplifiers in FIG. 2 also suggest another means for modifying the Lissajous figure formed on the screen of CRT 12. Since each deflection circuit has its own independent deflection amplifier, 11a and 11b, the deflection gain of either the vertical or the horizontal deflection circuits may be independently established. Variations of the gain in either channel will affect the shape of the pattern displayed.

The state of the art today is such that time delays, for purposes such as herein espoused, may be more handily achieved than the illustration of FIG. 2 suggests. Integrated circuit (IC) technology provides multi-stage delay lines in convenient miniaturized form. These IC analog delay lines are basically bucket brigade, charge transfer devices. A clock pulse is required to advance an input signal through each stage of delay in the analog delay line. The higher the clock rate, the smaller the transit time delay through the device. Since IC technology also provides variable clock devices which may be used in conjunction with the IC analog delay line, the ability to provide a controlled, variable delay for use with the invention is available. By way of illustration, and not of limitation, the IC analog delay line may utilize the SAD 512 D chip manufactured by Reticon Corporation of Sunnyvale, Calif. This is a sampled analog delay which uses N-channel silicon gate technology in bucket brigade configuration to provide a five-hundred-twelve stage analog delay line.

FIG. 3 introduces the concept of a controlled variable delay element as the time delay 13 first discussed with reference to FIG. 1. Time delay 13 here consists of analog delay line 133 and clock 134. If the SAD 512 D chip is employed as the analog delay line element, then a five-hundred-twelve stage delay line will be presented to the incoming signal. This signal will pass through ADL 133, moving from stage to stage at a propagation rate determined by clock 134. For example, if a clock capable of variation between one kc and ten kc is employed, then the input signal to ADL 133 will be clocked therethrough in transit times ranging from 1.0 milliseconds down to 0.1 milliseconds.

The advantage of having a variable time delay lies in the fact that certain signals, although randomly varying, will have frequently sustained passages in which there is little change, if any, in the frequency output by the signal source. In such cases, as already noted, simple elliptic figures are formed on the face of the CRT screen. By extending the delay time such that it becomes greater than the duration of such sustained frequency signals, the more involved reentrant patterns become available for presentation on the CRT. The rate of change of frequency of the incoming signals may well dictate the optimum delay time required of time delay 13 in order to produce the most aesthetically pleasing Lissajous patterns on the face of the CRT screen.

What I have described herein is a new way for obtaining interesting, pleasing Lissajous patterns on a CRT screen by applying the signal from a common source to the deflection circuits of said CRT. The innovative concept lies in the introduction of a time delay, as opposed to a mere phase delay, in the transit path between the signal and one or the other of the deflection circuits of the CRT. When used with a multiple gun, color CRT, such as is presently used with today's television sets, my invention produces elliptic and reentrant figures, each in its own pure, consistant coloration. Thus, when a typical present day TV tube is utilized, the red gun will produce a pure red pattern throughout the figure; so, too, the green gun will produce a green pattern only and the blue gun a blue, solely. No attempt has been made in practicing my invention to require that the beams be skewed so as to strike phosphors of varying hue, as some of the prior art may require. Varying color effects may be achieved by intensity modulation of the beams of the individual color guns. Variation of the time delay and of the individual deflection gains will have an effect on the Lissajous figures presented. The invention is not limited to use with a multiple electron-gun tube, as some of the prior art is, and pleasing effects are achieved with single gun CRT's which phosphoresce in the color selected by, and personally pleasing to the viewer. The invention lends itself for use in speech therapy and may be applied to multiple-CRT projection systems.

Lest the invention be inadvertently limited, it would be well to define my use of the term "randomly variable signals" and other terms of the like import. The invention produces the most aesthetically pleasing visual effects when the rate of change of frequency of the input signal is such that the time delay element in one deflection circuit results in the simultaneous presentation at the deflection plates of signals of different frequencies. Music, for example, provides an ideal signal for use with the invention. Yet music is not truly random, displaying a certain repetitiousness and periodicity. In a given musical composition, this repetitiousness may be visually discerned in the Lissajous figures provided by my invention and the periodicity anticipated by the viewer. When the audio and visual effects are presented to the listener/viewer the perception is a pleasurable experience.

The invention will produce the familiar, simple elliptical Lissajous figures even if the signal from the single source is not varying. The terms "randomly variable signals" and the like, as used herein, are to be taken as signals which produce the more involved and interesting reentrant Lissajous figures rather than being limited in meaning to signals which are truly random, non-repetitious and non-periodic.

Having described my invention in a clear and concise manner such that those skilled in the art may understand and practice it and having illustrated several embodiments thereof,

I claim:

1. In a cathode ray tube (CRT) having the necessary associated power supplies and sweep deflection means to produce a visually discernable image on the screen of said CRT when signals are applied to said deflection means a method of producing Lissajous figure imagery on said screen when the signals applied to said deflection means are derived from a common signal source comprising the steps of:
   (a) applying a first part of said signal from said common signal source to deflection means producing a first sweep deflection of the electron beam of said CRT;
   (b) applying a second part of said signal from said common signal source through a time delay element to deflection means producing a second sweep deflection of said electron beam at an angle displaced from that of said first sweep deflection,
   whereby the deflection imagery derived on the screen of said CRT is the instantaneous resultant of said first and said second sweep deflections of said electron beam.

2. Means for producing Lissajous patterns on a CRT having the necessary associated power supplies and first and second sweep deflection means to produce a discernible image on the screen of said CRT when the deflection signals utilized to form said Lissajous patterns are derived from a single signal source comprising:
   (a) a single signal source;
   (b) means for inputting signals from said source to both said first and said second deflection means of said CRT;
   (b) time delay means in the transit path between said means for inputting said signal and said second deflection means;
   whereby a time differential will exist between the application of said signal at said first deflection means and its application at said second deflection means, and a Lissajous pattern will be traced on the CRT screen.

3. The time delay means of claim 2 comprising:
   (a) an analog delay line, and
   (b) a clock for generating a clock signal to be applied to said delay line so as to clock said signal through said delay line for application to said second deflection means.

4. The clock of claim 3 having control means to selectably establish the frequency of said clock signal so as to control the transit time delay of said signal through said analog delay line.

* * * * *